United States Patent [19]

Harrison

[11] Patent Number: 4,488,267
[45] Date of Patent: Dec. 11, 1984

[54] INTEGRATED CIRCUIT CHIPS WITH REMOVABLE DRIVERS AND/OR BUFFERS

[75] Inventor: Marc L. Harrison, Morganville, N.J.

[73] Assignee: AT&T Bell Laboratories, Murray Hill, N.J.

[21] Appl. No.: 381,187

[22] Filed: May 24, 1982

[51] Int. Cl.³ .............................................. G11C 13/00
[52] U.S. Cl. ..................... 365/201; 371/21; 371/15
[58] Field of Search .................... 371/15, 21; 365/174, 365/201

[56] References Cited

PUBLICATIONS

IBM, Tech. Dis. Bul., vol. 15, No. 9, Feb. 1973, pp. 2935-2936, "Shift Register Tester on a Chip", by Barnard et al.
IBM Tech. Dis. Bul., vol. 21, No. 1, Jun. 1978, pp. 5-6, "On-Chip Testing of a Single-Chip Micro Processor", by Leininger.
IBM Tech. Dis. Bul., vol. 19, No. 2, Jul. 1976, "Read-Only Store Checking for Reliability", by Nicoletti.
IBM Tech. Dis. Bul., vol. 17, No. 7, Dec. 1974, "Trouble Shooting LSI Circuit Units", by Howe et al., pp. 1941-1944.

Primary Examiner—Terrell W. Fears
Attorney, Agent, or Firm—Herbert M. Shapiro

[57] ABSTRACT

The organization of a frame portion of an integrated circuit chip to include buffers and drivers as well as a power supply for testing functional elements arranged in a "framed" portion of the chip permits smaller drivers and buffers and a lower power supply to be used during later normal operation. The frame portion may be separated completely after testing.

7 Claims, 5 Drawing Figures

INTEGRATED CIRCUIT CHIPS WITH REMOVABLE DRIVERS AND/OR BUFFERS

FIELD OF THE INVENTION

This invention relates to integrated circuit devices and, more particularly, to such devices in which a number of logic, memory and control functions are defined for cooperation, for example, as a microprocessor.

BACKGROUND OF THE INVENTION

Integrated circuit devices typically include a single semiconductor chip in which a number of functional elements are defined as is well understood. These functional elements could include a programmable logic array (PLA), an instruction register, memory, bus lines, etc. as would be present in a microprocessor. These functional elements are laid out on the chip in a manner to conserve space and are connected electrically to peripherally placed lands or pads. Electrical connection to the outside world is made to these pads typically through a hermetically-sealed, dual-in-line package (DIP pack) characterized by two parallel rows of pins.

Electrical interface circuits such as input buffers are commonly associated with some of the peripherally placed pads. Often difficult electrical interface circuits such as output drivers are associated with other pads. Also, both an input buffer and an output driver may be associated with a single pad. Input buffers provide an impedance match to that of the driver as well as any voltage or current translation which may be required. Output drivers provide the voltage and current levels necessary to interface to other chips or devices (i.e., LEDs, transistors, etc.). Both buffers and drivers provide protection from voltage spikes due, for example, to static charge build-up—an especially important consideration for MOS logic, from which many integrated circuits are fabricated.

Many situations exist in which the driver and buffer associated with each pad are unnecessary in the final package; for example, they are necessary only for chip testing to interface with existing test systems. The drivers and buffers, of course, require significant amounts of space and consume significant power. Consequently, the inclusion of the buffers and drivers necessitates larger packages to house the elements and to dissipate heat. Particularly in cases where the final packaged device is to be connected to another integrated circuit with similar input/output characteristics with a minimum of capacitance, the buffers and drivers could be eliminated or reduced in size significantly.

But as stated hereinbefore, the buffers and drivers are necessary for testing. Ideally, the buffers and drivers could be included in the test machine probe card. But, this approach appears unlikely because the capacitance of the test probes alone exceeds the drive capability of the unbuffered MOS drivers. The problem thus is to provide a semiconductor chip with adequate drive capability for testing, yet eliminate unnecessary circuitry in the final product.

BRIEF DESCRIPTION OF THE INVENTION

The invention is based on the realization that a semiconductor chip in which multiple function blocks are defined can be defined in at least first and second separate areas. The first area contains the circuitry (input/output) and pads necessary to interface with test equipment; the second area contains the remaining function blocks. Both areas are equipped with peripheral pads to which external electrical interconnections may be made. In addition, electrical connections are formed between the pads of the second area and the input/output circuitry of the first area, in a manner to permit testing.

In one embodiment, a first area is defined with pads and I/O circuitry in a partial frame geometry to encompass a second area. The second area contains all the remaining function blocks and a number of pads corresponding to the number in the frame. But the second area includes minimal I/O circuitry. Fine line, electrically conducting patterns connect the pads of the two areas. After testing, the conducting patterns are severed leaving a fully functioning device without the unnecessary I/O circuitry. Either a subset or all of the pads of an integrated circuit could be configured this way.

DETAILED DESCRIPTION

Figure 1:
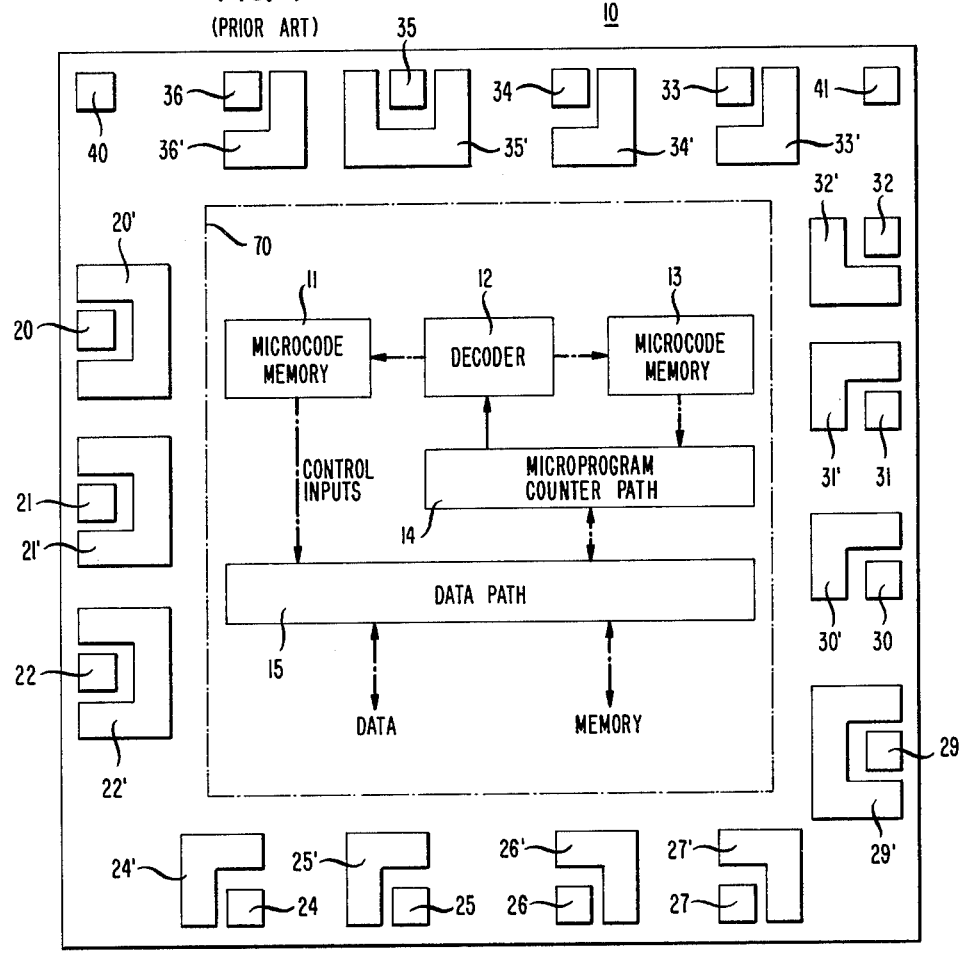
FIG. 1 shows an enlarged schematic block diagram of the functional layout of a prior art integrated circuit (IC) chip.

FIG. 1 shows a semiconductor, integrated circuit chip 10. The chip has defined within it a plurality of functional areas which are represented as (function) blocks 11, 12, 13, 14 and 15. Block 11 represents a microcode memory, block 12 represents a decoder; 13 represents another microcode memory. Block 14 represents a microprogram counter path and block 15 represents the data path. This organization of an illustrative prior art chip is shown and discussed in *An Introduction to VLSI Systems*, Carver Mead and Lynn Conway, 1980, Addison-Wesley, at page 203.

Chip 10 also includes a number of pads 20–22, 24–27, 29–32, 33–36, 40, and 41. Pads 20–22, 29 and 35 are encompassed by U-shaped blocks 20', 21', 22', 29' and 35' which represent both driver and buffer input/output (I/O) circuitry. Interconnections to off-chip elements for both input and output operations are made through the associated pads.

Other pads are adapted either for input or output operations but not both. For example, pads 24, 25, 32, 33, 34 and 36 have L-shaped blocks 24', 25', 32', 33', 34' and 36' associated with them. These pads are adapted by such circuitry for output operations only. Similarly, pads 26, 27, 30, and 31 have circuitry represented by L-shaped blocks 26', 27', 30' and 31' associated with them. Pads 26, 27, 30 and 31 are adapted by the circuitry for input operations only. The various pads and associated circuitry dictate the permissible interconnections between the chip of FIG. 1 and others with which that chip will cooperate in a system environment.

Figure 2:
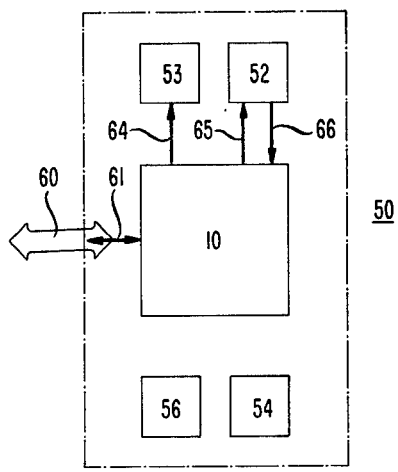
FIG. 2 shows a schematic block diagram of a variety of cooperating IC chips on a PC board.

The system environment is defined by interconnections between chips often secured to a printed circuit (PC) board. FIG. 2 shows one such board 50 to which chip 10 is secured in the usual manner. FIG. 2 shows several other chips 52, 53, 54 and 56 secured to board 50 also.

Interconnections between the chips required different power levels depending on the nature of the cooperation between the chip. Interconnections where several connections occur require high drive capability. Double-headed arrow 60 represents one set of such I/O interconnections to off-chip elements and electrical conductor 61, which would be connected, say, to pad 22 of FIG. 1, requires, say, a 5 volt power supply. Electrical conductors 64 and 65 may be involved only with output operations requiring low current and voltage. These conductors may be connected to pads 31 and 36 of FIG. 1, respectively. Conductor 66 connected between chips 10 and 52 may be involved only with inputs to chip 10 requiring low voltage. Land 34 of FIG. 1 is suitable for connection to conductor 65. Other chips 54 and 56 are similarly interconnected. But the interconnections are not shown or described. Suffice it to say that a PC board houses many chips with interconnections between them and to elements external to the board and that the power (or the electrical interface in general) required at a particular pad differs depending upon the function served and the number of interconnections to that pad. Pads 40 and 41 are the power pad and ground, respectively, for a power supply of, say, 5 volts.

But testing frequently requires high power at every pad. Consequently, relatively large and high capacitance circuitry is required around each pad in prior art circuits for providing such power even though normal operation permits low power operation and concomitant low capacitance.

Figure 3:
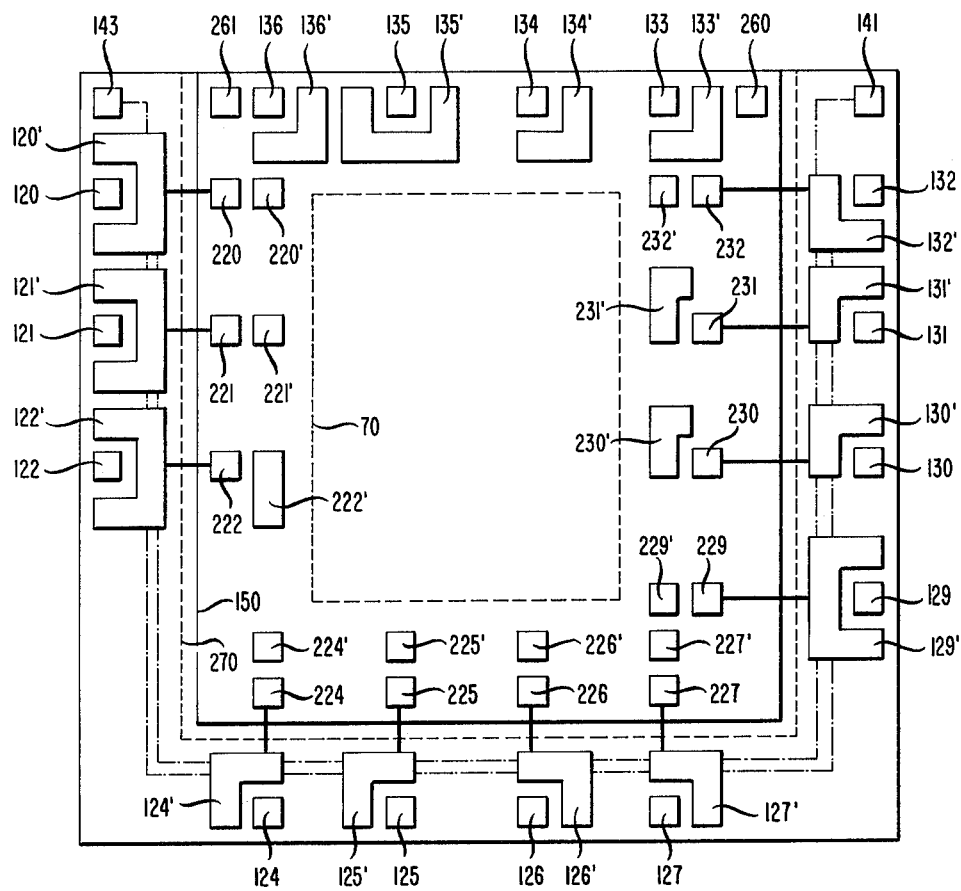
FIG. 3 shows an enlarged schematic block diagram of the functional layout of an IC chip in accordance with this invention.

FIG. 3 shows an arrangement in accordance with this invention where the circuit of the type enclosed within broken line 70 of FIG. 1 is shown in an environment which permits testing at high power and normal operation at various power levels without any speed penalty associated with unnecessary high capacitance circuitry. Notice that two sets of pads are shown. One set is numbered, along with associated driver circuitry, to correspond to pads and circuitry in FIG. 1 except preceded by the digit 1. Connection to the external world for testing is made via these pads. An additional pad, 141, is included for connection to a 5 volt power supply and is electrically connected in series to the I/O circuitry associated with all the pads 120–122, 124–127 and 129–132. Also, a ground connection may be made to each pad from pad 143.

The circuitry associated with each pad 120–122, 124–127 and 129–132 is electrically connected to a second internal pad shown within imaginary demarcation line 150 which separates the chip into a first (partial frame area) and a second (framed) area. These pads are identified to correspond with the associated pads but are preceded by a numeral 2 rather than 1. The associated circuitry is identified similarly but with a prime (') added. Also within line 150 is included a, say, 2.5 volt power pad 260 and a ground pad 261 for powering all circuits 220'–222', 224'–227' and 229'–232'.

Testing is carried out through the outer pads. Thereafter, the chip is (laser or diamond) scribed along broken line 270 breaking all the electrical connections between circuitry 120' to 132' and pads 220 and 232.

Figure 4:
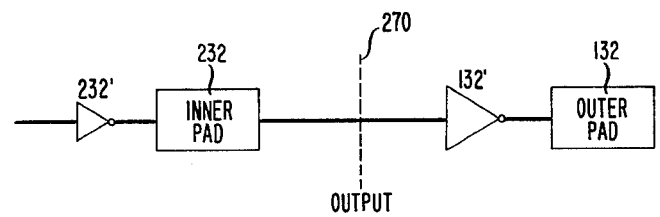
FIGS. 4 and 5 are schematic circuit diagrams of portions of the chip of FIG. 3.

FIG. 4 represents a typical (output) arrangement of an associated pair of pads and circuitry in FIG. 3. For example, the output circuit arrangement comprising circuits 232' and 132' along with pads 232 and 132 are represented. Typically driver circuit 132' is much larger than driver circuit 232' and has a much larger current drain associated with it. When the interconnection between circuit 132' and pad 232 is severed along line 270, the larger current drain is no longer of significance.

The portion of the chip outside of line 270 may be separated completely if desired. But it may be left in place if it is desired to use the 5 volt power supply as well as the 2.5 volt supply. For example, pin out connections could be made to both sets of pads for interfacing to two different voltage levels.

Figure 5:
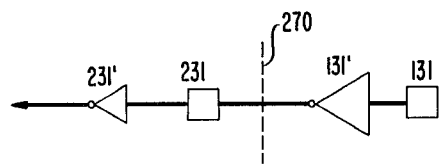

FIG. 5 represents a typical (input) arrangement of, say, elements 131, 131', 231 and 231' of FIG. 3. In this instance, driver 131' is much larger than driver 231'. Still, when the interconnection between circuit 131' and pad 231 is severed at 270, drive requirements are relatively low for later normal operation. The 5 volt supply need be provided only for testing and may then be thrown away if not used to advantage. By eliminating the electrical load associated with relatively larger drivers (and buffers) and particularly by employing relatively small circuits 220' to 232' of FIG. 3, current drain during normal operation is significantly reduced. This reduction leads to a significant increase, typically doubling, in operating speeds of the chip from, say, 6 to 12 megahertz.

The frame portion of the chip may be used to permit increased design flexibility to optimize local communication between different elements on a circuit board to, for example, use smaller drivers to reduce the number of cycles necessary for a given operation. For example, lower input impedance results in faster signal rise time.

The principles of the invention may be turned to account to design a chip requiring at least two distinct sets of interface requirements (i.e., voltage, power, impedance, size, etc.) of which normal microprocessor operation and testing constitute just one example.

What is claimed is:

1. An integrated circuit chip comprising at least first and second areas, means for defining a plurality of electrical circuit function blocks in said first area, means for defining a first set of pads and associated first electrical interface circuits in said first area for providing electrical access to said function blocks, means for defining a second set of pads and associate second electrical interface circuits in said second area, electrical conducting paths connected between said first set of pads and associated ones of said second electrical interface circuits in a manner to provide electrical access from associated ones of said second pads to said function blocks.

2. An integrated circuit chip in accordance with claim 1 wherein said second electrical interface circuits comprise electrical characteristics different from the corresponding ones of said first electrical interface circuits.

3. An integrated circuit chip in accordance with claim 2 wherein each of said first and second electrical interface circuits comprise buffers and drivers.

4. An integrated semiconductor chip in accordance with claim 2 wherein said first area defines at least a partial frame encompassing said second area and said pads included in said second area are arranged about the periphery of that area.

5. An integrated semiconductor chip including means for defining first, second, third ... n−mth, n−m+1th, ... nth functions therein, said first through said n-mth functions being necessary for operation as a fully functional device when interconnected with other chips, said n−m+1th through said nth functions being necessary solely for testing wherein said chip includes at least first and second areas, said first area including said n−m+1th through said nth functions, said second area including said 1th through said n-mth functions, wherein each of said first and second areas include bonding pads arranged about the periphery thereof, and a pattern of fine line, electrically-conducting connections between said pads of said first area and said means for defining said 1th through said n-mth functions.

6. An integrated semiconductor chip in accordance with claim 5 wherein said first area includes output drivers and a power supply.

7. An integrated semiconductor chip in accordance with claim 2 wherein said electrically-conducting paths are cut.

* * * * *